(12) United States Patent
Shi et al.

(10) Patent No.: US 10,235,958 B2
(45) Date of Patent: Mar. 19, 2019

(54) GATE DRIVING CIRCUITS AND LIQUID CRYSTAL DEVICES

(71) Applicant: Shenzhen China Star Optoelectronics Technology Co., Ltd., Shenzhen, Guangdong (CN)

(72) Inventors: Longqiang Shi, Guangdong (CN); Shu Jhih Chen, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 97 days.

(21) Appl. No.: 15/328,900

(22) PCT Filed: Jan. 17, 2017

(86) PCT No.: PCT/CN2017/071336
§ 371 (c)(1),
(2) Date: Jan. 24, 2017

(87) PCT Pub. No.: WO2018/120330
PCT Pub. Date: Jul. 5, 2018

(65) Prior Publication Data
US 2018/0211627 A1    Jul. 26, 2018

(51) Int. Cl.
*G09G 3/36* (2006.01)
(52) U.S. Cl.
CPC ... *G09G 3/3677* (2013.01); *G09G 2300/0814* (2013.01); *G09G 2310/0289* (2013.01)

(58) Field of Classification Search
None
See application file for complete search history.

(56) References Cited

U.S. PATENT DOCUMENTS

| | | | |
|---|---|---|---|
| 2008/0055293 A1 | 3/2008 | Kuo | |
| 2016/0140922 A1* | 5/2016 | Dai | G11C 19/287 345/92 |

FOREIGN PATENT DOCUMENTS

| | | |
|---|---|---|
| CN | 101122720 A | 2/2008 |
| CN | 201023156 A | 6/2010 |
| CN | 103730094 A | 4/2014 |
| CN | 106128380 A | 11/2016 |
| CN | 106128401 A | 11/2016 |

* cited by examiner

*Primary Examiner* — Kenneth B Lee, Jr.
(74) *Attorney, Agent, or Firm* — Andrew C. Cheng

(57) ABSTRACT

The present disclosure relates to a gate driving circuit including N number of cascaded-connected GOA driving units, wherein the GOA driving units at each of the levels includes a pull-up control circuit, a pull-up circuit, a level transfer circuit, a boast capacitor, and a pull-down holding circuit. The pull-down holding circuit of the GOA driving unit of the n-th level and the pull-down holding circuit of the GOA driving unit of the (n+1)-th level are turned on alternatedly. The pull-down holding circuit of die GOA driving unit of the n-th level may keep the potential of the node within the GOA driving units at the n-th and the (n+1)-th level in the off state, wherein n=1, 3, 5, ..., N−1, and N is an even number greater than one. The present disclosure also relates to a LCD including the above gate driving circuit.

18 Claims, 5 Drawing Sheets

GATE DRIVING CIRCUITS AND LIQUID CRYSTAL DEVICES

BACKGROUND OF THE INVENTION

1. Field of the Invention

The present disclosure relates to display technology, and more particularly to a gate driving circuit and the liquid crystal device (LCD) having the same.

2. Discussion of the Related Art

With respect to active LCDs, each of the pixels includes a thin film transistor (TFT), a gate (Gate) of the TFT connects to a horizontal scanning line, a drain of the TFT connects to a vertical data line, and a source of the TFT connects to a pixel electrode. When the horizontal scanning line is applied with an enough voltage, the TFTs on the scanning line are turned on. At this moment, the pixel electrode on the horizontal scanning lines connects with the vertical data line to write the display signals on the data line to the pixel so as to control the display performance by controlling the transmittance of the liquid crystals. Currently, the horizontal scanning line of LCDs is mainly driven by an external IC for controlling the charging and the discharging of the horizontal scanning lines in a level-by-level manner. With respect to GOA technology, the original manufacturing process of the liquid crystal panel may be adopted to manufacture the driving circuit of the horizontal scanning line on a rim of the display area such that the external IC may drive the horizontal scanning lines. The GOA technology may decrease the bonding process of the external IC so as to enhance the efficiency and to reduce the product cost. In addition, the liquid crystal panel is more appropriate for narrow-border or no-border display devices.

Conventionally, the GOA driving circuit includes a plurality cascaded-connected GOA units, and each of the GOA units drives one horizontal scanning line accordingly. The GOA circuit includes a pull-up part, a pull-up control part, a transfer part, a pull-down holding part, and a boost capacitor for pulling up the potential. The pull-up part is responsible for outputting the clock signals (Clock) to be the gate signals (Gate). The pull-up control part controls a turn-on time of the pull-up part, and connects to the transfer signals or gate signals transmitted from the GOA circuit at a preceding level. The pull-down holding part maintains the Gate output signals and holds the Gate signals of the pull-up part, which is referred to as the Q node) in an off state, i.e., a low level potential. The C boost conducts a secondary raise-up to the Q node, which contributes to the Gate signals output of the pull-up part.

The pull-down holding part usually includes a plurality of transistor. To maintain the performance of the TFTs of the pull-down holding part, the GOA unit at each of the levels includes two sets of pull-down holding part for pulling down the gate control signals and the scanning driving signals to be at the low potential in an alternated manner. However, as additional one pull-down holding part is configured, the number of the TFT is greater, which increases the complexity and the cost of the manufacturing process. Further, as the GOA circuit is manufactured on the array substrate directly, the greater number of TFTs is not beneficial to the narrow border design.

SUMMARY

In view of the above, the gate driving circuit is proposed, wherein one pull-down holding circuit is shared by two adjacent GOA driving units. As such, while the performance of the pull-down holding circuit may be maintained, the number of the TFTs adopted by the GOA driving unit at each of the levels may be lowered down. This not only reduces the cost of the product, but also contributes to the narrow-border design.

In one aspect, a gate driving circuit includes: N number of cascaded-connected GOA driving units, wherein the GOA driving units at each of the levels includes a pull-up control circuit, a pull-up circuit, a level transfer circuit, a boost capacitor, and a pull-down holding circuit; the pull-down holding circuit of the GOA driving unit of the n-th level and the pull-down holding circuit of the GOA driving unit of the (n+1)-th level are turned on alternatedly; when the pull-down holding circuit of the GOA driving unit at the n-th level is turned on, the pull-down holding circuit of the GOA driving unit respectively connects output ends of the pull-up control circuit, the pull-up circuit, and the level transfer circuit of the GOA driving units at the n-th level and the GOA driving units at the (n+1)-th level to reference low-potential signals; when the pull-down holding circuit of the GOA driving unit at the (n+1)-th level is turned on, the pull-down holding circuit respectively connects the output ends of the pull-up control circuit, the pull-up circuit, and the level transfer circuit of the GOA driving unit at the n-th level and the GOA driving unit at the (n+1)-th level to the reference low-potential signals; wherein n=1, 3, 5, ..., N−1, and N is an even number greater than one.

Wherein the pull-down holding circuit includes a transistor control unit, a first switch module, and a second switch module, the first switch module, and the second switch module, respectively connect between the output ends of the pull-up control circuit, the pull-up circuit, the level transfer circuit, and the reference low-potential signals; wherein the transistor control unit of the GOA driving unit of the n-th level provides first control signals to the first switch module of the GOA driving unit at the n-th level and the second switch module of the GOA driving unit at the (n+1)-th level, the transistor control unit of the GOA driving unit of the (n+1)-th level provides second control signals to the second switch module of the GOA driving unit at the n-th level and the first switch module of the GOA driving unit at the (n+1)-th level; wherein the transistor control unit of the GOA driving unit at the n-th level and the transistor control unit of the GOA driving unit at the (n+1)-th level outputs the first control signals and the second control signals in an alternated manner.

Wherein the transistor control unit of the GOA driving unit of the n-th level outputs the first control signals in accordance with the first pull-down clock signals, and the transistor control unit of the GOA driving unit of the (n+1)-th level outputs the second control signals in accordance with the second pull-down clock signals; and wherein the first pull-down clock signals and the second pull-down clock signals are logically inverted.

Wherein the first switch module, includes a first pull-down transistor, a second pull-down transistor, and a third pull-down transistor, the second switch module, includes a fourth pull-down transistor, a fifth pull-down transistor, and a sixth pull-down transistor; wherein drains of the first pull-down transistor, the second pull-down transistor, the third pull-down transistor, the fourth pull-down transistor, the fifth pull-down transistor, and the sixth pull-down transistor respectively connects to the reference low-potential signals, sources of the first pull-down transistor and the fourth pull-down transistor respectively connect to the output end of the pull-up control circuit, the second pull-down transistor and the fifth pull-down transistor respectively connect to the output end of the level transfer circuit, sources of the third pull-down transistor and the sixth pull-down transistor respectively connect to the output end of the pull-up circuit; with respect to the GOA driving units at the n-th level, gates of the first pull-down transistor, second pull-down transistor, and the third pull-down transistor connects to the first control signals, gates of the fourth pull-down transistor, the fifth pull-down transistor, and the sixth pull-down transistor connects to the second control signals; and with respect to the GOA driving unit at the (n+1)-th level, gates of the first pull-down transistor, the second pull-down transistor, and the third pull-down transistor connects to the second control signals, and gates of the fourth pull-down transistor, the fifth pull-down transistor, and the sixth pull-down transistor connects to the first control signals.

Wherein the transistor control unit of the GOA driving unit of the n-th level outputs the first control signals in accordance with the first pull-down clock signals, and the transistor control unit of the GOA driving unit of the (n+1)-th level outputs the second control signals in accordance with the second pull-down clock signals; and wherein the first pull-down clock signals and the second pull-down clock signals are logically inverted.

Wherein the transistor control unit, includes a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals; with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals; wherein with respect to the GOA driving unit of the (n+1)-th level, the sources of the first controllable transistor and the third controllable transistor connect to the second pull-down clock signals, the gate of the second controllable transistor and the gate of the fourth controllable transistor respectively connect to the output end of the pull-up control circuit of the GOA driving unit of the (n+)-th level, the drain of the third controllable transistor outputs the second control signals; and the gate of the third controllable transistor of the GOA driving unit of the n-th level and the gate of the third controllable transistor of the GOA driving unit of the (n+1)-th level are interconnected.

Wherein the transistor control unit, includes a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals; with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals; wherein with respect to the GOA driving unit of the (n+1)-th level, the sources of the first controllable transistor and the third controllable transistor connect to the second pull-down clock signals, the gate of the second controllable transistor and the gate of the fourth controllable transistor respectively connect to the output end of the pull-up control circuit of the GOA driving unit of the (n+1)-th level, the drain of the third controllable transistor outputs the second control signals; and the gate of the third controllable transistor of the GOA driving unit of the n-th level and the gate of the third controllable transistor of the GOA driving unit of the (n+1)-th level are interconnected.

Wherein the transistor control unit, further includes a fifth controllable transistor, a source of the fifth controllable transistor connects to the drain of the third controllable transistor, and a drain of the fifth controllable transistor connects to the reference low-potential signals; and a gate of the fifth controllable transistor of the GOA driving unit of the n-th level connects to the output end of the pull-up control circuit of the GOA driving unit of the (n+1)-th level, and with respect to the GOA driving unit of the (n+1)-th level, the gate of the fifth controllable transistor connects to the output end of the pull-up control circuit of the GOA driving unit of the n-th level.

Wherein the transistor control unit, includes a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals; the transistor control unit, further includes a sixth controllable transistor, a source of the sixth controllable transistor connects to the drain of the first controllable transistor, a drain of the sixth controllable transistor connects to the reference low-potential signals; with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals; with respect to the GOA driving unit of the (n+1)-th level, the sources of the first controllable transistor and the third controllable transistor connect to the second pull-down clock signals, the gate of the second controllable transistor and the gate of the fourth controllable transistor respectively connect to the output end of the pull-up control circuit of the GOA driving unit of the (n+1)-th level, the drain of the third controllable transistor outputs the second control signals.

Wherein the transistor control unit, further includes a fifth controllable transistor, a source of the fifth controllable transistor connects to the drain of the third controllable transistor, and a drain of the fifth controllable transistor connects to the reference low-potential signals; and a gate of the fifth controllable transistor of the GOA driving unit of the n-th level connects to the output end of the pull-up control circuit of the GOA driving unit of the (n+1)-th level, and with respect to the GOA driving unit of the (n+1)-th level, the gate of the fifth controllable transistor connects to the output end of the pull-up control circuit of the GOA driving unit of the n-th level.

Wherein the transistor control unit, further includes a fifth controllable transistor, a source of the fifth controllable transistor connects to the drain of the third controllable transistor, and a drain of the fifth controllable transistor connects to the reference low-potential signals; and a gate of the fifth controllable transistor of the GOA driving unit of the n-th level connects to the output end of the pull-up control circuit of the GOA driving unit of the (n+1)-th level, and with respect to the GOA driving unit of the (n+1)-th level, the gate of the fifth controllable transistor connects to the output end of the pull-up control circuit of the GOA driving unit of the n-th level.

Wherein the pull-up control circuit includes a first pull-up transistor and a second pull-up transistor, gates of the first pull-up transistor and the second pull-up transistor are interconnected to receive the first clock signals, a source of the first pull-up transistor receives the transfer signals of the (n−4)-th level with respect to the n-th level, a drain of the first pull-up transistor connects to a source of the second pull-up transistor, a drain of the second pull-up transistor operates as an output end of the pull-up control circuit to output the gate control signals of the current level; the pull-up circuit includes a fourth pull-up transistor, a gate of the fourth pull-up transistor connects to the output end of the pull-up control circuit to receive the gate control signals, a source of the fourth pull-up transistor connects to the second clock signals, and a drain of the fourth pull-up transistor connects to the output end of the pull-up circuit to output the scanning driving signals of the current level; the level transfer circuit includes a transfer transistor, a gate of the transfer transistor connects to the output end of the pull-up control circuit to receive the gate control signals, a source of the transfer transistor connects to the second clock signals, a drain of the transfer transistor operates as the output end of the level transfer circuit to output the transfer signals of the current level; the boast capacitor connects between the output end of the pull-up control circuit and the output end of the pull-up circuit; and the second clock signals and the first clock signals are logically inverted.

In another aspect, a liquid crystal device (LCD) includes: a gate driving circuit comprising N number of cascaded-connected GOA driving units, wherein the GOA driving units at each of the levels includes a pull-up control circuit, a pull-up circuit, a level transfer circuit, a boast capacitor, and a pull-down holding circuit; the pull-down holding circuit of the GOA driving unit of the n-th level and the pull-down holding circuit of the GOA driving unit of the (n+1)-th level are turned on alternatedly; when the pull-down holding circuit of the GOA driving unit at the n-th level is turned on, the pull-down holding circuit of the GOA driving unit respectively connects output ends of the pull-up control circuit, the pull-up circuit, and the level transfer circuit of the GOA driving units at the n-th level and the GOA driving units at the (n+1)-th level to reference low-potential signals; when the pull-down holding circuit of the GOA driving unit at the (n+1)-th level is turned on, the pull-down holding circuit respectively connects the output ends of the pull-up control circuit, the pull-up circuit, and the level transfer circuit of the GOA driving unit at the n-th level and the GOA driving unit at the (n+1)-th level to the reference low-potential signals; wherein n=1, 3, 5, . . . , N−1, and N is an even number greater than one.

Wherein the pull-down holding circuit includes a transistor control unit, a first switch module, and a second switch module, the first switch module, and the second switch module, respectively connect between the output ends of the pull-up control circuit, the pull-up circuit, the level transfer circuit, and the reference low-potential signals; wherein the transistor control unit of the GOA driving unit of the n-th level provides first control signals to the first switch module of the GOA driving unit at the n-th level and the second switch module of the GOA driving unit at the (n+1)-th level, the transistor control unit of the GOA driving unit of the (n+1)-th level provides second control signals to the second switch module of the GOA driving unit at the n-th level and the first switch module of the GOA driving unit at the (n+1)-th level; wherein the transistor control unit of the GOA driving unit at the n-th level and the transistor control unit of the GOA driving unit at the (n+1)-th level outputs the first control signals and the second control signals in an alternated manner.

Wherein the transistor control unit of the GOA driving unit of the n-th level outputs the first control signals in accordance with the first pull-down clock signals, and the transistor control unit of the GOA driving unit of the (n+1)-th level outputs the second control signals in accordance with the second pull-down clock signals; and wherein the first pull-down clock signals and the second pull-down clock signals are logically inverted.

Wherein the first switch module, includes a first pull-down transistor, a second pull-down transistor, and a third pull-down transistor, the second switch module, includes a fourth pull-down transistor, a fifth pull-down transistor, and a sixth pull-down transistor; wherein drains of the first pull-down transistor, the second pull-down transistor, the third pull-down transistor, the fourth pull-down transistor, the fifth pull-down transistor, and the sixth pull-down transistor respectively connects to the reference low-potential signals, sources of the first pull-down transistor and the fourth pull-down transistor respectively connect to the output end of the pull-up control circuit, the second pull-down transistor and the fifth pull-down transistor respectively connect to the output end of the level transfer circuit, sources of the third pull-down transistor and the sixth pull-down transistor respectively connect to the output end of the pull-up circuit; with respect to the GOA driving units at the n-th level, gates of the first pull-down transistor, second pull-down transistor, and the third pull-down transistor connects to the first control signals, gates of the fourth pull-down transistor, the fifth pull-down transistor, and the sixth pull-down transistor connects to the second control signals; and with respect to the GOA driving unit at the (n+1)-th level, gates of the first pull-down transistor, the second pull-down transistor, and the third pull-down transistor connects to the second control signals, and gates of the fourth pull-down transistor, the fifth pull-down transistor, and the sixth pull-down transistor connects to the first control signals.

Wherein the transistor control unit of the GOA driving unit of the n-th level outputs the first control signals in accordance with the first pull-down clock signals, and the transistor control unit of the GOA driving unit of the (n+1)-th level outputs the second control signals in accordance with the second pull-down clock signals; and wherein the first pull-down clock signals and the second pull-down clock signals are logically inverted.

Wherein the transistor control unit, includes a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals; with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals; wherein with respect to the GOA driving unit of the (n+1)-th level, the sources of the first controllable transistor and the third controllable transistor connect to die second pull-down clock signals, the gate of the second controllable transistor and the gate of the fourth controllable transistor respectively connect to the output end of the pull-up control circuit of the GOA driving unit of the (n+1)-th level, the drain of the third controllable transistor outputs the second control signals; and the gate of the third controllable transistor of the GOA driving unit of the n-th level and the gate of the third controllable transistor of the GOA driving unit of the (n+1)-th level are interconnected.

In view of the above, the GOA driving unit of each of the levels is configured with a pull-down holding circuit, and the two adjacent GOA driving units at two levels share the pull-down holding circuit of the GOA driving unit at the two levels. That is, the GOA driving unit at each of the levels corresponds to two pull-down holding circuit, and each of the pull-down holding circuit corresponds to the GOA driving units at two levels. As such, while the performance of the pull-down holding circuit may be maintained, the number of the TFTs adopted by the GOA driving unit at each of the levels may be lowered down. This not only reduces the cost of the product, but also contributes to the narrow-border design.

DETAILED DESCRIPTION OF THE EMBODIMENTS

Figure 1:
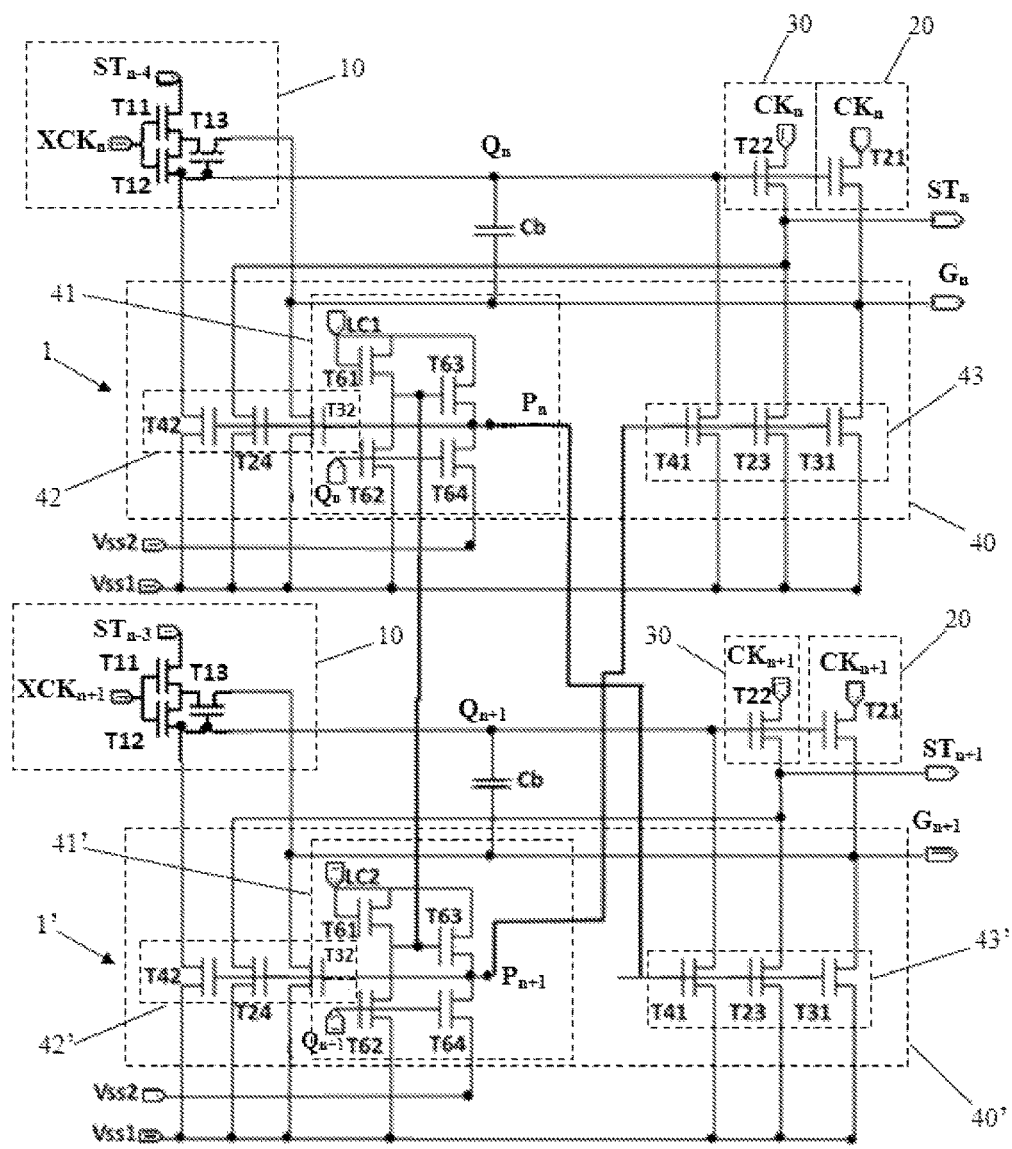
FIG. 1 is a circuit diagram of the gate driving circuit in accordance with a first embodiment.

Embodiments of the invention will now be described more fully hereinafter with reference to the accompanying drawings, in which embodiments of the invention are shown.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

First Embodiment

A gate driving circuit includes N number of cascaded-connected GOA driving units. In response to the control of the GOA driving unit at the n-th level, the horizontal scanning line at the n-th level provides scanning driving signal ($G_n$) to a display area. As shown in FIG. 1, each of die GOA driving unit 1, 1' includes a pull-up control circuit 10, a pull-up circuit 20, a level transfer circuit 30, a boast capacitor (Cb), and a pull-down holding circuit 40, 40'.

The pull-up control circuit 10 generates gate control signals at the n-th level in accordance with transfer signals at the (n−4)-th level and first clock signals. Specifically, as shown in FIG. 1, the pull-up control circuit 10 includes a first pull-up transistor (T11) and a second pull-up transistor (T12), gates of the first pull-up transistor (T11) and the second pull-up transistor (T12) are interconnected to receive the first clock signals, a source of the first pull-up transistor (T11) receives the transfer signals of the (n−4)-th level with respect to the n-th level, a drain of the first pull-up transistor (T11) connects to a source of the second pull-up transistor (T12), a drain of the second pull-up transistor (T12) operates as an output end of the pull-up control circuit 10 to output the gate control signals of the current level. For instance, with respect to the GOA driving unit 1 at the n-th level, the corresponding first clock signals are denoted as $XCK_x$, the corresponding transfer signals of the (n−4)-th level are denoted as the $ST_{n-4}$, and the GOA driving unit 1 outputs the gate control signal ($Q_n$) of the current level. With respect to the GOA driving unit 1' at the (n+1)-th level, the corresponding first clock signals are denoted as $XCK_{x+1}$, the corresponding transfer signals of the (n−4)-th level are denoted as the $ST_{n-3}$, and the GOA driving unit 1 outputs the gate control signal ($Q_{n+1}$) of the current level. It is to be noted that when the $ST_{n-4}$ does not exit, the STY signals within the Tcon may be adopted.

Figure 2:
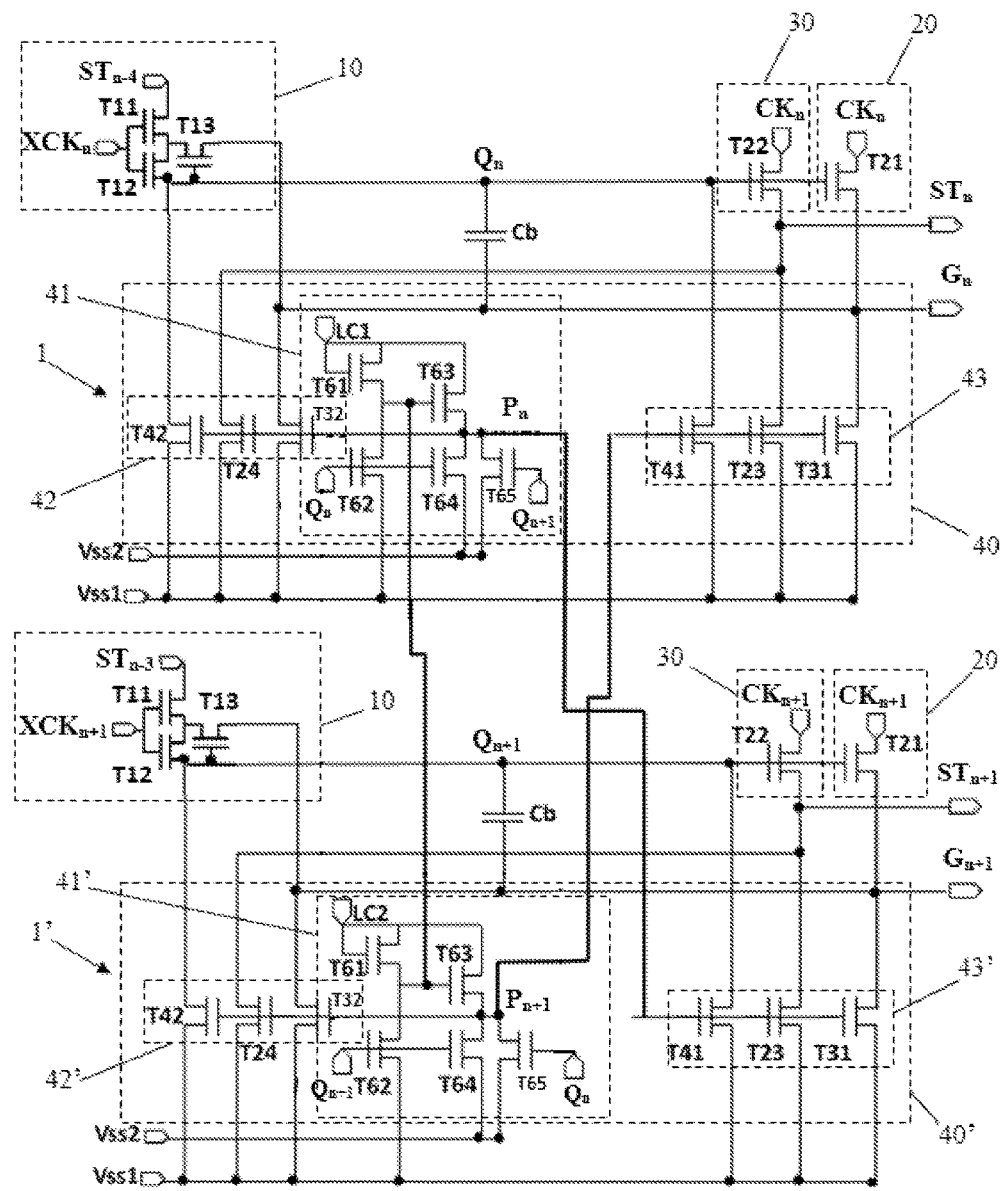
FIG. 2 is a circuit diagram of the gate driving circuit in accordance with a second embodiment.

The pull-up circuit 20 is controlled by the gate control signals to convert the received second clock signals to be the scanning driving signals to be outputted. Specifically, the pull-up circuit 20 includes a fourth pull-up transistor (T21), a gate of the fourth pull-up transistor (T21) connects to the output end of the pull-up control circuit 10 to receive the gate control signals, a source of the fourth pull-up transistor (T21) connects to the second clock signals, and a drain of the fourth pull-up transistor (T21) connects to the output end of the pull-up circuit 20 to output the scanning driving signals of the current level. As shown in FIG. 2, with respect to the GOA driving unit 1 at the n-th level, a gate of the fourth pull-up transistor (T21) receives the gate control signal ($Q_n$), a source of the fourth pull-up transistor (T21) corresponds to the second clock signals ($CK_x$), and a drain of the fourth pull-up transistor (T21) outputs the scanning driving signal ($G_n$) of the current level.

With respect to the GOA driving unit 1 at the (n+1)-th level, a gate of the fourth pull-up transistor (T21) receives the gate control signal ($Q_{n+1}$), a source of the fourth pull-up transistor (T21) corresponds to the second clock signals ($CK_{x+1}$), and a drain of the fourth pull-up transistor (T21) outputs the scanning driving signal ($G_{n+1}$) of the current level, wherein the first clock signals ($XCK_x$, $XCK_{x+1}$) and the second clock signals ($CK_x$, $CK_{x+1}$) are logically inverted. In addition, x is the serial number of the clock signals, and x is a positive integer. In one embodiment, 8 clock signals are adopted, and the clock signals include four pairs of clock signals that are logically inverted.

The boast capacitor (Cb) connects between the output end of the pull-up control circuit 10 and the output end of the pull-up circuit 20. That is, two ends of the boast capacitor (Cb) respectively connects to the gate control signals ($Q_n$, $Q_{n+1}$) and the scanning driving signal ($G_n$, $G_{n+1}$). The boast capacitor (Cb) stores the voltage of the gate of the fourth pull-up transistor (T21) when the gate control signals ($Q_n$, $Q_{n+1}$) are at the high potential. The boast capacitor (Cb) may further raise the potential of the gate of the fourth pull-up transistor (T21) such that the fourth pull-up transistor (T21) may be reliably turned on to output the scanning driving signals. After the scanning driving signals of the current level are completed, the low potential is kept during the scanning process is applied to other rows.

The level transfer circuit 30 includes a transfer transistor (T22), a gate of the transfer transistor (T22) connects to the output end of the pull-up control circuit 10 to receive the gate control signals ($Q_n$), a source of the transfer transistor (T22) connects to the second clock signals ($CK_x$), a drain of the transfer transistor (T22) operates as the output end of the level transfer circuit 30 to output the transfer signals of the current level. The transfer signals are configured to control the pull-up control circuits for the four levels behind by the transfer signals. This control is not conducted by the scanning driving signals such that the scanning driving signals may be more reliable. Referring to FIG. 1, with respect to the GOA driving unit 1 at the n-th level, a gate of the transfer transistor (T22) receives the gate control signal ($Q_n$), a source of the transfer transistor (T22) corresponds to the second clock signals ($CK_x$), a drain of the transfer transistor (T22) outputs the transfer signals (ST) of the current level.

With respect to the GOA driving unit 1' at the (n+1)-th level, a gate of the transfer transistor (T22) receives the gate control signal ($Q_{x+1}$), a source of the transfer transistor (T22) corresponds to the second clock signals ($CK_{x+1}$), a drain of the transfer transistor (T22) outputs the transfer signals ($ST_{n+1}$) of the current level.

The pull-down holding circuit 40 is configured to pull down the potential of some major nodes to be at the low level when the GOA driving unit is in non-outputting timing sequence. In the embodiment, the GOA driving unit 1, 1' at the n-th and the (n+1)-th level have a shared pull-down holding circuit 40, 40'. Specifically, the GOA driving unit 1 at the n-th level includes the pull-down holding circuit 40, and the GOA driving unit 1' at the (n+1)-th level includes the pull-down holding circuit 40'. The pull-down holding circuit 40, 40' are turned on in an alternated manner.

When the pull-down holding circuit 40 of the GOA driving unit 1 at the n-th level is turned on, the pull-down holding circuit 40 of the GOA driving unit 1 respectively connects the output ends of the pull-up control circuit 10, the pull-up circuit 20, and the level transfer circuit 30 of the GOA driving unit 1 at the n-th level and the GOA driving unit 1' at the (n+1)-th level to the reference low-potential signals.

When the pull-down holding circuit 40' of the GOA driving unit 1' at the (n+1)-th level is turned on, the pull-down holding circuit 40' of the GOA driving unit respectively connects the output ends of the pull-up control circuit 10, the pull-up circuit 20, and the level transfer circuit 30 of the GOA driving unit 1' at the n-th level and the GOA driving unit 1' at the (n+1)-th level to the reference low-potential signals, wherein n=1, 3, 5, . . . , N−1, and N is an even number greater than one.

As shown in FIG. 1, the pull-down holding circuit 40, 40' includes a transistor control unit 41, 41', a first switch module 42, 42', and a second switch module 43, 43'. The first switch module 42, 42' and the second switch module 43, 43' respectively connect between the output ends of the pull-up control circuit 10, the pull-up circuit 20, the level transfer circuit 30, and the reference low-potential signals, wherein the transistor control unit 41 of the GOA driving unit 1 of the n-th level provides first control signals ($P_{n+1}$) to the first switch module 42 of the GOA driving unit 1 at the n-th level and the second switch module 43' of the GOA driving unit 1' at the (n+1)-th level, the transistor control unit 41' of the GOA driving unit 1' of the (n+1)-th level provides second control signals ($P_{n+1}$) to the second switch module 43 of the GOA driving unit 1 at the n-th level and the first switch module 43' of the GOA driving unit 1' at the (n+1)-th level; wherein the transistor control unit 41 of the GOA driving unit 1 at the n-th level and the transistor control unit 41' of the GOA driving unit 1' at the (n+1)-th level outputs the first control signals ($P_n$) and the second control signals ($P_{n+1}$) in an alternated manner.

As shown in FIG. 1, the first switch module 42, 42' includes a first pull-down transistor (T42), a second pull-down transistor (T24), and a third pull-down transistor (T32), the second switch module 43, 43' includes a fourth pull-down transistor (T41), a fifth pull-down transistor (T23), and a sixth pull-down transistor (T31), wherein drains of the first pull-down transistor (T42), the second pull-down transistor (T24), the third pull-down transistor (T32), the fourth pull-down transistor (T41), the fifth pull-down transistor (T23), and the sixth pull-down transistor (T31) respectively connects to the reference low-potential signals, sources of the first pull-down transistor (T42) and the fourth pull-down transistor (T41) respectively connect to the output end of the pull-up control circuit 10, the second pull-down transistor (T24) and the fifth pull-down transistor (T23) respectively connect to the output end of the level transfer circuit 30, sources of the third pull-down transistor (T32) and the sixth pull-down transistor (T31) respectively connect to the output end of the pull-up circuit 20. With respect to the GOA driving units 1 at the n-th level, gates of the first pull-down transistor (T42), second pull-down transistor (T24), and the third pull-down transistor (T32) connects to the first control signals ($P_n$), gates of the fourth pull-down transistor (T41), the fifth pull-down transistor (T23), and the sixth pull-down transistor (T31) connects to the second control signals ($P_{n+1}$). With respect to the GOA driving unit at the (n+1)-th level, gates of the first pull-down transistor (T42), the second pull-down transistor (T24), and the third pull-down transistor (T32) connects to the second control signals ($P_{n+1}$), and gates of the fourth pull-down transistor (T41), the fifth pull-down transistor (T23), and the sixth pull-down transistor (T31) connects to the first control signals ($P_n$).

Wherein the transistor control unit 41 of the GOA driving unit 1 of the n-th level outputs the first control signals ($P_n$) in accordance with the first pull-down clock signals (LC1), and the transistor control unit 41' of the GOA driving unit 1' of the (n+)-th level outputs the second control signals ($P_{n+1}$) in accordance with the second pull-down clock signals (LC2), wherein the first pull-down clock signals (LC1) and the second pull-down clock signals (LC2) are logically inverted. It is to be noted that the first pull-down clock signals (LC1) and the second pull-down clock signals (LC2) are one pair of low-frequency signals that are logically inverted, and the first clock signals ($XCK_x$) and the second clock signals ($CK_x$) are high-frequency signals that are logically inverted.

Further, the transistor control unit 41, 41' further connects to the output ends of the pull-up control circuit 10 of the GOA driving unit 1 of the n-th level and the GOA driving unit 1' of the (n+1)-th level. When the output ends of the pull-up control circuit 10 of the GOA driving unit 1 of the n-th level and the GOA driving unit 1' of the (n+1)-th level outputs the high potential, the first switch module 42, 42' and the second switch module 43, 43' correspond to the transistor control unit 41, 41' are turned off, the connections between the gate control signal ($Q_n$, $Q_{n+1}$) the scanning driving signal ($G_n$, $G_{n+1}$), and the reference low-potential signals are cut off such that the gate control signal ($Q_n$, $Q_{n+1}$) and the scanning driving signal ($G_n$, $G_{n+1}$) may stably climb up to the high potential.

Specifically, as shown in FIG. 1, the transistor control unit 41, 41' includes a first controllable transistor (T61), a second controllable transistor (T62), a third controllable transistor (T63), and a fourth controllable transistor (T64). A gate and a source of the first controllable transistor (T61) are interconnected to receive the corresponding pull-down clock signals, a drain of the first controllable transistor (T61) connects to a source of the second controllable transistor (T62), a drain of the second controllable transistor (T62) connects to the reference low-potential signals, a source of the third controllable transistor (T63) connects to the first controllable transistor (T61) to receive the pull-down clock signals, a drain of the third controllable transistor (T63) connects to a source of the fourth controllable transistor (T64), a drain of the fourth controllable transistor (T64) connects to the reference low-potential signals. With respect to the GOA driving unit 1 of the n-th level, a drain of the first controllable transistor (T61) and a source of the third controllable transistor (T63) connects to the first pull-down clock signals (LC1), a gate of the second controllable transistor (T62) and a gate of the fourth controllable transistor (T64) respectively connect to the output end of the pull-up control circuit 10 of the GOA driving unit 1 of the n-th level, a drain of the third controllable transistor (T63) outputs the first control signals ($P_n$). With respect to the GOA driving unit 1' of the (n+1)-th level, the sources of the first controllable transistor (T61) and the third controllable transistor (T63) connect to the second pull-down clock signals (LC2), the gate of the second controllable transistor (T62) and the gate of the fourth controllable transistor (T64) respectively connect to the output end of the pull-up control circuit 10 of the GOA driving unit 1' of the (n+1)-th level, the drain of the third controllable transistor (T63) outputs the second control signals ($P_{n+1}$). In addition, the gate of the third controllable transistor (T63) of the GOA driving unit 1 of the n-th level and the gate of the third controllable transistor (T63) of the GOA driving unit 1' of the (n+1)-th level are interconnected.

Further, the embodiment, to make the circuit more stable, the reference low-potential signals include first reference low-potential signals (Vss1) and second reference low-potential signals (Vss2), the drains of the first pull-down transistor (T42), the second pull-down transistor (T24), the third pull-down transistor (T32), the fourth pull-down transistor (T41), the fifth pull-down transistor (T23), and the sixth pull-down transistor (T31) respectively connect to the first reference low-potential signals (Vss1), the drain of the second controllable transistor (T62) connects to the first reference low-potential signals (Vss1), the drain of the fourth controllable transistor (T64) connects to the second reference low-potential signals (Vss2), wherein the potential of the first reference low-potential signals (Vss1) is lower than the potential of the second reference low-potential signals (Vss2).

Further, as shown in FIG. 1, to make the circuit more stable, the pull-up control circuit 1 further includes a third pull-up transistor (T13), a gate of the third pull-up transistor (T13) connects to the drain of the second pull-up transistor (T12), the source of the third pull-up transistor (T13) connects to the drain of the first pull-up transistor (T11), the gate of the third pull-up transistor (T13) connects to the output end of the pull-up circuit 20. It is to be noted that when the thirteenth pull-up transistor (T13) is turned on, the resistance between the source and the drain are very huge, and the current is very small, and the resistance and the current are configured such that the potential of the output end of the pull-up circuit 20 are not affected.

The operations of the gate driving circuit will be described as below:

(1) With respect to the GOA driving unit 1 of the n-th level, when the first pull-down clock signals (LC1) and the second pull-down clock signals (LC2) are at the low potential, the control signals ($P_n$) are at the high potential and the second control signals ($P_{n+1}$) are at the low potential. The first switch module 42 of the GOA driving unit 1 of the n-th level and the second switch module 43' of the GOA driving unit 1' of the (n+1)-th level are turned on, that is, the gate driving signals, the transfer signals, and the scanning driving signals of the GOA driving unit 1 of the n-th level and the GOA driving unit 1' of the (n+1)-th level are pulled down to the reference low-potential signals.

(2) Before being transmitted to the GOA driving unit at the n-th level, the first clock signals ($XCK_x$) and the corresponding transfer signals ($ST_{n-4}$) at the (n−4)-th level are at the high potential, the fourth pull-up transistor (T21) is turned on; as the second clock signals ($CK_x$) are opposite to the first clock signals ($XCK_x$), that is, the first clock signals ($XCK_x$) are at the low potential, the scanning driving signal ($G_n$) are at the low potential. As the node ($Q_n$) is at the high potential, the control signals ($P_n$) are pulled down to be at the low potential, the connections between the gate control signals ($Q_n$), the scanning driving signal, and the transfer signals of the GOA driving unit 1 of the n-th level and the GOA driving unit 1' of the (n+1)-th level and the reference low-potential signals are cut off.

(3) Before being transmitted to the GOA driving unit 1' of the (n+1)-th level, the first clock signals ($XCK_x$) and the corresponding transfer signals ($ST_{n-3}$) at the (n−4)-th level are at the low potential, the node ($Q_{n+1}$) is at the high potential, and the fourth pull-up transistor (T21) is turned on. At this moment, the second clock signals ($CK_{x+1}$) and the first clock signals ($XCK_{x+1}$) are logically inverted, that is, the second clock signals ($CK_{x+1}$) are at the high potential, and the scanning driving signals ($G_{n+1}$) are at the low potential. As the node ($Q_{n+1}$) is at the high potential, the gate of the third controllable transistor (T63) is at the low potential such that the first control signals ($P_n$) is maintained at the low potential.

(4) The first clock signals ($XCK_x$) and the second clock signals ($CK_x$) enter into the next timing sequence. With respect to the GOA driving unit 1 of the n-th level, the first clock signals ($XCK_x$) and the corresponding transfer signals ($ST_{n-4}$) are at the low potential. Due to the boost capacitor (Cb), the node ($Q_n$) is maintained at the high potential, and the first control signals ($P_n$) are maintained at the low potential. The fourth pull-up transistor (T21) is maintained in an on-state. At this moment, the second clock signals ($CK_x$) and the first clock signals ($XCK_x$) are logically inverted, that is, the second clock signals ($CK_x$) are at the high potential, the scanning driving signal ($G_n$) outputs the high potential to scan the corresponding rows.

(5) The first clock signals ($XCK_{x+1}$) and the second clock signals ($CK_{x+1}$) enter into the next timing sequence. With respect to the GOA driving unit 1' of the (n+1)-th level, the first clock signals ($XCK_{x+i}$) and the corresponding transfer signals ($ST_{n-3}$) at the (n-4)-th level are at the low potential. Due to the boost capacitor (Cb), the node ($Q_{n+1}$) is maintained at the high potential, and the first control signals ($P_n$) are maintained at the low potential. The fourth pull-up transistor (T21) is maintained in the on-state. At this moment, the second clock signals ($CK_{x+1}$) and the first clock signals ($XCK_{x+1}$) are logically inverted, that is, the second clock signals ($CK_{x+1}$) are at the high potential, the scanning driving signal ($G_{n+1}$) outputs the high potential to scan the corresponding rows.

(6) The first clock signals ($XCK_x$) and the second clock signals ($CK_x$) enter into the next timing sequence. With respect to the GOA driving unit 1 of the n-th level, the first clock signals ($XCK_x$) and the corresponding transfer signals ($ST_{n-4}$) at the (n-4)-th level are at the low potential. The node (Q) transits to the low potential, and the second clock signals ($CK_x$) are at the low potential. At this moment, the scanning driving signal (GO are at the low potential to scan the corresponding rows. As the node ($Q_{n+1}$) is still at the high potential, the gate of the third controllable transistor (T63) of the GOA driving unit 1 of the n-th level and the gate of the third controllable transistor (T63) of the GOA driving unit 1' of the (n+1)-th level are interconnected. The gate of the third controllable transistor (T63) is at the low potential, and the first control signals ($P_n$) is maintained at the low potential.

(7) The first clock signals ($XCK_{x+1}$) and the second clock signals ($CK_{x+1}$) enter into the next timing sequence. With respect to the GOA driving unit 1' of the (n+1)-th level, the first clock signals ($XCK_{x+1}$) are at the high potential and the corresponding transfer signals ($ST_{n-3}$) of the (n-4)-th level at the low potential, the node ($Q_{n+1}$) transits to the low potential, and the second clock signals ($CK_{x+1}$) are at the low level; the scanning driving signal ($G_{n+1}$) are at the low potential to scan the corresponding rows. At this moment, the node ($Q_n$) of the GOA driving unit 1 of the n-th level is at the low potential, and the node ($Q_{n+1}$) of the GOA driving unit 1' of the (n+1)-th level is at the low potential, the first control signals ($P_n$) transits to the high level, the first switch module 42 and the second switch module 43' are turned on, that is, the gate control signals, the transfer signals, and the scanning driving signals of the GOA driving unit 1 of the n-th level and of the GOA driving unit 1' of the (n+1)-th level are pulled down to the reference low-potential signals, and are maintained at the low potential so as to be in the off-state.

In view of the above, the GOA driving unit of each of the levels is configured with a pull-down holding circuit, and the two adjacent GOA driving units at two levels share the pull-down holding circuit of the GOA driving unit at the two levels. That is, the GOA driving unit at each of the levels corresponds to two pull-down holding circuit, and each of the pull-down holding circuit corresponds to the GOA driving units at two levels. As such, while the performance of the pull-down holding circuit may be maintained, the number of the TFTs adopted by the GOA driving unit at each of the levels may be lowered down. This not only reduces the cost of the product, but also contributes to the narrow-border design.

Second Embodiment

The difference between the second embodiment and the first embodiment resides in that: in FIG. 2, the transistor control unit 41, 41' further includes a fifth controllable transistor (T65), a source of the fifth controllable transistor (T65) connects to the drain of the third controllable transistor (T63), and a drain of the fifth controllable transistor (T65) connects to the reference low-potential signals.

A gate of the fifth controllable transistor (T65) of the GOA driving unit 1 of the n-th level connects to the output end of the pull-up control circuit 10 of the GOA driving unit 1' of the (n+1)-th level, i.e., the node ($Q_{n+1}$). With respect to the GOA driving unit 1' of the (n+1)-th level, the gate of the fifth controllable transistor (T65) connects to the output end of the pull-up control circuit 10 of the GOA driving unit 1 of the n-th level, i.e., the node ($Q_n$).

The difference between the operations of the gate driving signals in the second embodiment and the first embodiment resides in that: in the first embodiment, with respect to the control of the first control signals ($P_n$), when the node ($Q_{n+1}$) is at the high potential, only the gate of the third controllable transistor (T63) is pulled down to the low potential. In the second embodiment, when the node ($Q_{n+1}$) is at the high potential, the gate and the drain of the third controllable transistor (T63) are pulled down to the low potential such that the potential and timing sequence of the first control signals ($P_n$) may be more precise.

Correspondingly, within the controlled timing sequence of the second control signals ($P_{n+1}$), that is, the node ($Q_n$) is at the high potential, the gate and the drain of the third controllable transistor (T63) are pulled down to the low potential such that the potential and timing sequence of the first control signals ($P_{n+1}$) may be more precise.

Third Embodiment

Figure 3:
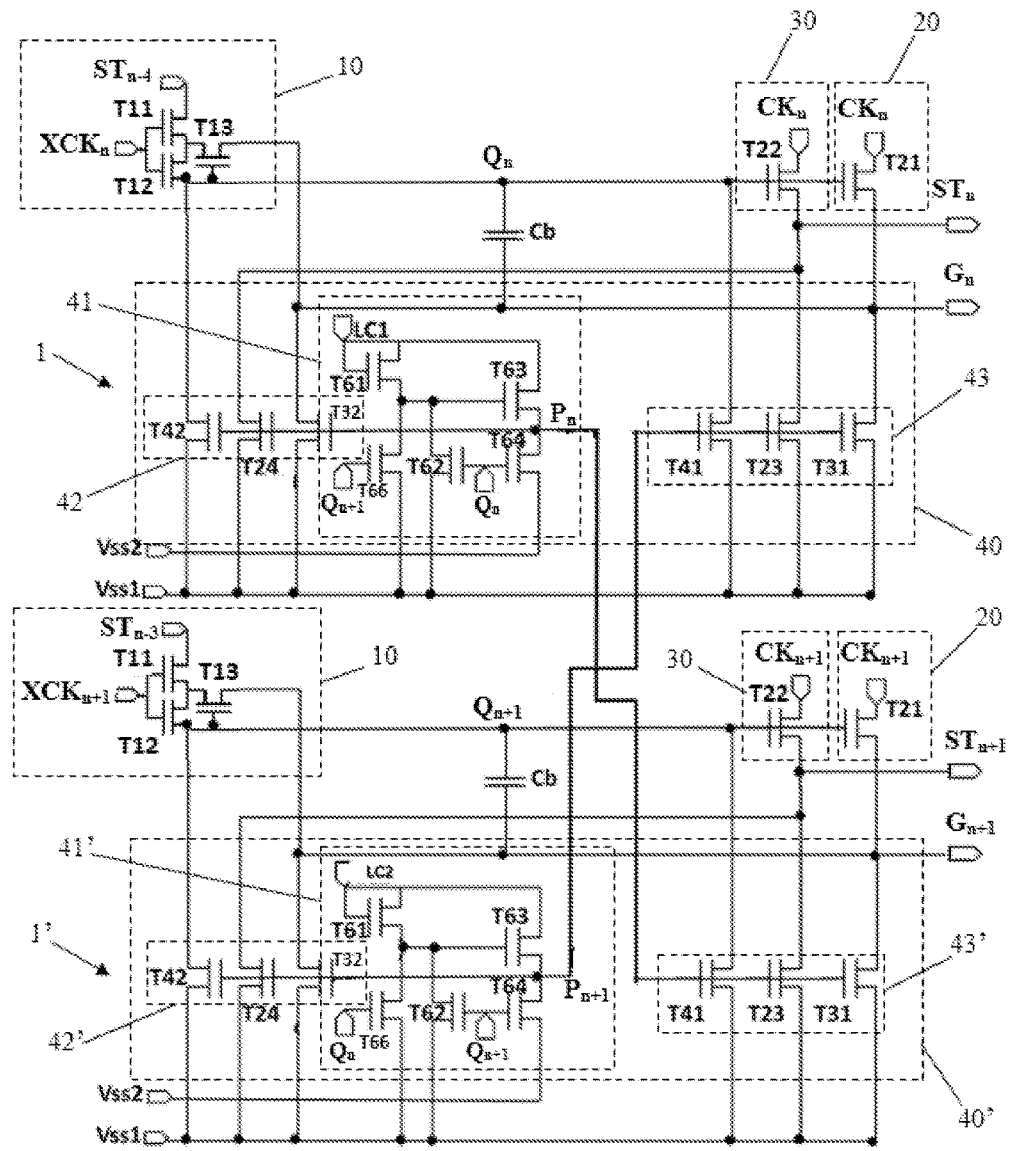
FIG. 3 is a circuit diagram of the gate driving circuit in accordance with a third embodiment.

The difference between the third embodiment and the first embodiment resides in that: in FIG. 3, the transistor control unit 41, 41' further includes a sixth controllable transistor (T66), a source of the sixth controllable transistor (T66) connects to the drain of the first controllable transistor (T61), a drain of the sixth controllable transistor (T66) connects to the reference low-potential signals. In addition, the gate of the third controllable transistor (T63) of the GOA driving unit 1 of the n-th level and the gate of the third controllable transistor (T63) of the GOA driving unit 1' of the (n+1)-th level are not connected.

The gate of the sixth controllable transistor (T66) of the GOA driving unit 1 of the n-th level connects to the output end of the pull-up control circuit 10 of the GOA driving unit 1' of the (n+1)-th level, i.e., the node ($Q_{n+1}$). The gate of the sixth controllable transistor (T66) of the GOA driving unit 1' of the (n+1)-th level connects to the output end of the pull-up control circuit 10 of the GOA driving unit 1 of the n-th level, i.e., node ($Q_n$).

The difference between the operations of the gate driving signals in the third embodiment and the first embodiment resides in that: in the first embodiment, with respect to the control of the first control signals ($P_n$), when the node ($Q_{n+1}$) is at the high potential, only the gate of the third controllable transistor (T63) connects to the reference low-potential signals via the sixth controllable transistor (T66) such that the first control signals ($P_n$) is maintained at the low potential. With respect to the GOA driving unit 1' of the (n+1)-th level, the second control signals ($P_{n+1}$) are controlled such that when the node ($Q_n$) is at the high potential, the gate of the third controllable transistor (T63) is connected to the reference low-potential signals via the sixth controllable transistor (T66). As such, the second control signals ($P_{n+1}$) are maintained at the low potential.

Fourth Embodiment

Figure 4:
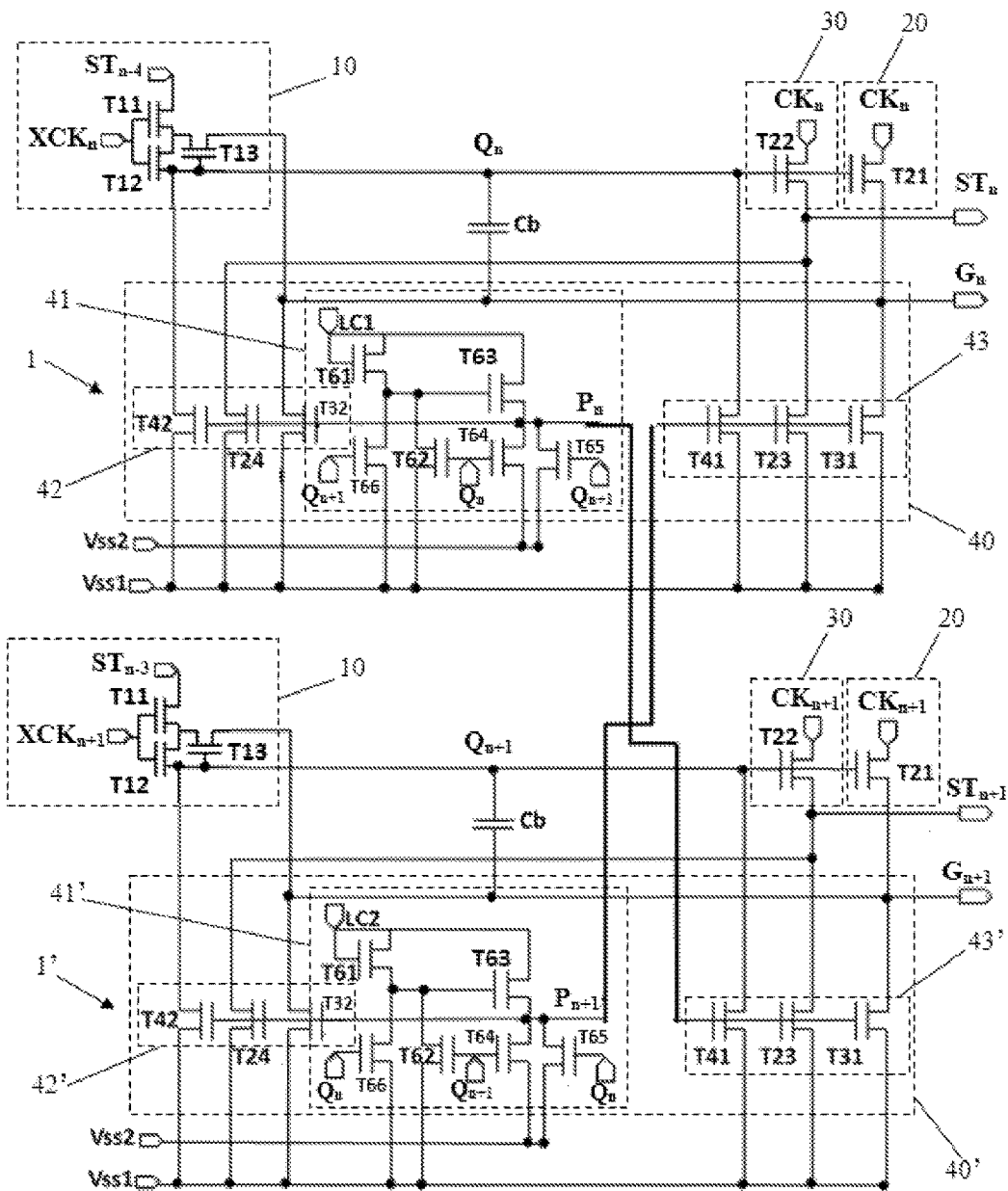
FIG. 4 is a circuit diagram of the gate driving circuit in accordance with a fourth embodiment.

The difference between the fourth embodiment and the third embodiment resides in that: in FIG. 4, the transistor control unit 41, 41' further includes a fifth controllable transistor (T65), a source of the fifth controllable transistor (T65) connects to the drain of the third controllable transistor (T63), a drain of the fifth controllable transistor (T65) connects to the reference low-potential signals.

A gate of the fifth controllable transistor (T65) of the GOA driving unit 1 of the n-th level connects to the output end of the pull-up control circuit 10 of the GOA driving unit 1' of the (n+1)-th level, i.e., the node ($Q_n$). The gate of the fifth controllable transistor (T65) of the GOA driving unit 1' of the (n+1)-th level connects to the output end of the pull-up control circuit 10 of the GOA driving unit 1 of the n-th level, i.e., the node ($Q_{n+1}$).

The difference between the operations of the gate driving signals in the fourth embodiment and the third embodiment resides in that: in the third embodiment, with respect to the control of the first control signals ($P_n$), when the node ($Q_{n+1}$) is at the high potential, only the gate of the third controllable transistor (T63) is pulled down to the low potential. In the fourth embodiment, when the node ($Q_{n+1}$) is at the high potential, the gate and the drain of the third controllable transistor (T63) are pulled down to the low potential such that the potential and timing sequence of the first control signals ($P_n$) may be more precise.

Correspondingly, within the controlled timing sequence of the second control signals ($P_{n+1}$), that is, the node ($Q_n$) is at the high potential, the gate and the drain of the third controllable transistor (T63) are pulled down to the low potential such that the potential and timing sequence of the first control signals ($P_{n+1}$) may be more precise.

Fifth Embodiment

Figure 5:
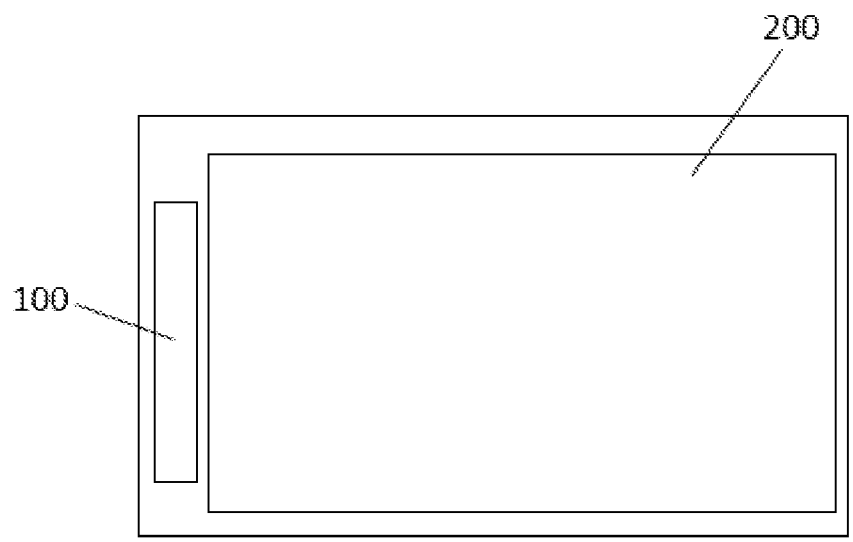
FIG. 5 is a schematic view of the LCD in accordance with a fifth embodiment.

FIG. 5 is a schematic view of the LCD including a display area 200 and a gate driving signals 100 integrated in a rim of the display area 200. The gate driving circuit 100 may be the above gate driving circuit. To enhance the driving capability, the gate driving circuit may be arranged at two opposite sides of the display area 200.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A gate driving circuit, comprising:
N number of cascaded-connected GOA driving units, wherein the GOA driving units at each of the levels comprises a pull-up control circuit, a pull-up circuit, a level transfer circuit, a boast capacitor, and a pull-down holding circuit;
the pull-down holding circuit of the GOA driving unit of the n-th level and the pull-down holding circuit of the GOA driving unit of the (n+1)-th level are turned on alternatedly;
when the pull-down holding circuit of the GOA driving unit at the n-th level is turned on, the pull-down holding circuit of the GOA driving unit respectively connects output ends of the pull-up control circuit, the pull-up circuit, and the level transfer circuit of the GOA driving units at the n-th level and the GOA driving units at the (n+1)-th level to reference low-potential signals;
when the pull-down holding circuit of the GOA driving unit at the (n+1)-th level is turned on, the pull-down holding circuit respectively connects the output ends of the pull-up control circuit, the pull-up circuit, and the level transfer circuit of the GOA driving unit at the n-th level and the GOA driving unit at the (n+1)-th level to the reference low-potential signals;
wherein n=1, 3, 5, . . . , N−1, and N is an even number greater than one;
wherein the pull-down holding circuit comprises a transistor control unit, a first switch module, and a second switch module, the first switch module, and the second switch module, respectively connect between the output ends of the pull-up control circuit, the pull-up circuit, the level transfer circuit, and the reference low-potential signals;
wherein the transistor control unit of the GOA driving unit of the n-th level provides first control signals to the first switch module of the GOA driving unit at the n-th level and the second switch module of the GOA driving unit at the (n+1)-th level, the transistor control unit of the GOA driving unit of the (n+1)-th level provides second control signals to the second switch module of the GOA driving unit at the n-th level and the first switch module of the GOA driving unit at the (n+1)-th level;
wherein the transistor control unit of the GOA driving unit at the n-th level and the transistor control unit of the GOA driving unit at the (n+1)-th level outputs the first control signals and the second control signals in an alternated manner.

2. The gate driving circuit as claimed in claim 1, wherein the transistor control unit of the GOA driving unit of the n-th level outputs the first control signals in accordance with the first pull-down clock signals, and the transistor control unit of the GOA driving unit of the (n+1)-th level outputs the second control signals in accordance with the second pull-down clock signals; and wherein the first pull-down clock signals and the second pull-down clock signals are logically inverted.

3. The gate driving circuit as claimed in claim 1, wherein the first switch module, comprises a first pull-down transistor, a second pull-down transistor, and a third pull-down transistor, the second switch module, comprises a fourth pull-down transistor, a fifth pull-down transistor, and a sixth pull-down transistor;

wherein drains of the first pull-down transistor, the second pull-down transistor, the third pull-down transistor, the fourth pull-down transistor, the fifth pull-down transistor, and the sixth pull-down transistor respectively connects to the reference low-potential signals, sources of the first pull-down transistor and the fourth pull-down transistor respectively connect to the output end of the pull-up control circuit, the second pull-down transistor and the fifth pull-down transistor respectively connect to the output end of the level transfer circuit, sources of the third pull-down transistor and the sixth pull-down transistor respectively connect to the output end of the pull-up circuit;

with respect to the GOA driving units at the n-th level, gates of the first pull-down transistor, second pull-down transistor, and the third pull-down transistor connects to the first control signals, gates of the fourth pull-down transistor, the fifth pull-down transistor, and the sixth pull-down transistor connects to the second control signals; and with respect to the GOA driving unit at the (n+1)-th level, gates of the first pull-down transistor, the second pull-down transistor, and the third pull-down transistor connects to the second control signals, and gates of the fourth pull-down transistor, the fifth pull-down transistor, and the sixth pull-down transistor connects to the first control signals.

4. The gate driving circuit as claimed in claim 3, wherein the transistor control unit of the GOA driving unit of the n-th level outputs the first control signals in accordance with the first pull-down clock signals, and the transistor control unit of the GOA driving unit of the (n+1)-th level outputs the second control signals in accordance with the second pull-down clock signals; and wherein the first pull-down clock signals and the second pull-down clock signals are logically inverted.

5. The gate driving circuit as claimed in claim 4, wherein the transistor control unit, comprises a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals;

with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals;

wherein with respect to the GOA driving unit of the (n+1)-th level, the sources of the first controllable transistor and the third controllable transistor connect to the second pull-down clock signals, the gate of the second controllable transistor and the gate of the fourth controllable transistor respectively connect to the output end of the pull-up control circuit of the GOA driving unit of the (n+1)-th level, the drain of the third controllable transistor outputs the second control signals; and the gate of the third controllable transistor of the GOA driving unit of the n-th level and the gate of the third controllable transistor of the GOA driving unit of the (n+1)-th level are interconnected.

6. The gate driving circuit as claimed in claim 2, wherein the transistor control unit, comprises a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals;

with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals;

wherein with respect to the GOA driving unit of the (n+1)-th level, the sources of the first controllable transistor and the third controllable transistor connect to the second pull-down clock signals, the gate of the second controllable transistor and the gate of the fourth controllable transistor respectively connect to the output end of the pull-up control circuit of the GOA driving unit of the (n+1)-th level, the drain of the third controllable transistor outputs the second control signals; and the gate of the third controllable transistor of the GOA driving unit of the n-th level and the gate of the third controllable transistor of the GOA driving unit of the (n+1)-th level are interconnected.

7. The gate driving circuit as claimed in claim 5, wherein the transistor control unit, further comprises a fifth controllable transistor, a source of the fifth controllable transistor connects to the drain of the third controllable transistor, and a drain of the fifth controllable transistor connects to the reference low-potential signals; and a gate of the fifth controllable transistor of the GOA driving unit of the n-th level connects to the output end of the pull-up control circuit of the GOA driving unit of the (n+1)-th level, and with respect to the GOA driving unit of the (n+1)-th level, the gate of the fifth controllable transistor connects to the output end of the pull-up control circuit of the GOA driving unit of the n-th level.

8. The gate driving circuit as claimed in claim 6, wherein the transistor control unit, further comprises a fifth controllable transistor, a source of the fifth controllable transistor connects to the drain of the third controllable transistor, and a drain of the fifth controllable transistor connects to the reference low-potential signals; and a gate of the fifth controllable transistor of the GOA driving unit of the n-th level connects to the output end of the pull-up control circuit of the GOA driving unit of the (n+1)-th level, and with respect to the GOA driving unit of the (n+1)-th level, the gate of the fifth controllable transistor connects to the output end of the pull-up control circuit of the GOA driving unit of the n-th level.

9. The gate driving circuit as claimed in claim 2, wherein the transistor control unit, comprises a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals;

the transistor control unit, further comprises a sixth controllable transistor, a source of the sixth controllable transistor connects to the drain of the first controllable transistor, a drain of the sixth controllable transistor connects to the reference low-potential signals;

with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals;

with respect to the GOA driving unit of the (n+1)-th level, the sources of the first controllable transistor and the third controllable transistor connect to the second pull-down clock signals, the gate of the second controllable transistor and the gate of the fourth controllable transistor respectively connect to the output end of the pull-up control circuit of the GOA driving unit of the (n+1)-th level, the drain of the third controllable transistor outputs the second control signals.

10. The gate driving circuit as claimed in claim 4, wherein the transistor control unit, comprises a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals;

the transistor control unit, further comprises a sixth controllable transistor, a source of the sixth controllable transistor connects to the drain of the first controllable transistor, a drain of the sixth controllable transistor connects to the reference low-potential signals;

with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals;

with respect to the GOA driving unit of the (n+1)-th level, the sources of the first controllable transistor and the third controllable transistor connect to the second pull-down clock signals, the gate of the second controllable transistor and the gate of the fourth controllable transistor respectively connect to the output end of the pull-up control circuit of the GOA driving unit of the (n+1)-th level, the drain of the third controllable transistor outputs the second control signals.

11. The gate driving circuit as claimed in claim 9, wherein the transistor control unit, further comprises a fifth controllable transistor, a source of the fifth controllable transistor connects to the drain of the third controllable transistor, and a drain of the fifth controllable transistor connects to the reference low-potential signals; and a gate of the fifth controllable transistor of the GOA driving unit of the n-th level connects to the output end of the pull-up control circuit of the GOA driving unit of the (n+1)-th level, and with respect to the GOA driving unit of the (n+1)-th level, the gate of the fifth controllable transistor connects to the output end of the pull-up control circuit of the GOA driving unit of the n-th level.

12. The gate driving circuit as claimed in claim 10, wherein the transistor control unit, further comprises a fifth controllable transistor, a source of the fifth controllable transistor connects to the drain of the third controllable transistor, and a drain of the fifth controllable transistor connects to the reference low-potential signals; and a gate of the fifth controllable transistor of the GOA driving unit of the n-th level connects to the output end of the pull-up control circuit of the GOA driving unit of the (n+1)-th level, and with respect to the GOA driving unit of the (n+1)-th level, the gate of the fifth controllable transistor connects to the output end of the pull-up control circuit of the GOA driving unit of the n-th level.

13. The gate driving circuit as claimed in claim 1, wherein the pull-up control circuit comprises a first pull-up transistor and a second pull-up transistor, gates of the first pull-up transistor and the second pull-up transistor are interconnected to receive the first clock signals, a source of the first pull-up transistor receives the transfer signals of the (n−4)-th level with respect to the n-th level, a drain of the first pull-up transistor connects to a source of the second pull-up transistor, a drain of the second pull-up transistor operates as an output end of the pull-up control circuit to output the gate control signals of the current level;

the pull-up circuit comprises a fourth pull-up transistor, a gate of the fourth pull-up transistor connects to the output end of the pull-up control circuit to receive the gate control signals, a source of the fourth pull-up transistor connects to the second clock signals, and a drain of the fourth pull-up transistor connects to the output end of the pull-up circuit to output the scanning driving signals of the current level;

the level transfer circuit comprises a transfer transistor, a gate of the transfer transistor connects to the output end of the pull-up control circuit to receive the gate control signals, a source of the transfer transistor connects to the second clock signals, a drain of the transfer transistor operates as the output end of the level transfer circuit to output the transfer signals of the current level;

the boast capacitor connects between the output end of the pull-up control circuit and the output end of the pull-up circuit; and the second clock signals and the first clock signals are logically inverted.

14. A liquid crystal device (LCD), comprising:

a gate driving circuit comprising N number of cascaded-connected GOA driving units, wherein the GOA driving units at each of the levels comprises a pull-up control circuit, a pull-up circuit, a level transfer circuit, a boast capacitor, and a pull-down holding circuit;

the pull-down holding circuit of the GOA driving unit of the n-th level and the pull-down holding circuit of the GOA driving unit of the (n+1)-th level are turned on alternatedly;

when the pull-down holding circuit of the GOA driving unit at the n-th level is turned on, the pull-down holding circuit of the GOA driving unit respectively connects output ends of the pull-up control circuit, the pull-up circuit, and the level transfer circuit of the GOA driving units at the n-th level and the GOA driving units at the (n+1)-th level to reference low-potential signals;

when the pull-down holding circuit of the GOA driving unit at the (n+1)-th level is turned on, the pull-down holding circuit respectively connects the output ends of the pull-up control circuit, the pull-up circuit, and the level transfer circuit of the GOA driving unit at the n-th level and the GOA driving unit at the (n+1)-th level to the reference low-potential signals;

wherein n=1, 3, 5, . . . , N−1, and N is an even number greater than one;

wherein the pull-down holding circuit comprises a transistor control unit, a first switch module, and a second switch module, the first switch module, and the second switch module, respectively connect between the output ends of the pull-up control circuit, the pull-up circuit, the level transfer circuit, and the reference low-potential signals;

wherein the transistor control unit of the GOA driving unit of the n-th level provides first control signals to the first switch module of the GOA driving unit at the n-th level and the second switch module of the GOA driving unit at the (n+1)-th level, the transistor control unit of the GOA driving unit of the (n+1)-th level provides second control signals to the second switch module of the GOA driving unit at the n-th level and the first switch module of the GOA driving unit at the (n+1)-th level;

wherein the transistor control unit of the GOA driving unit at the n-th level and the transistor control unit of the GOA driving unit at the (n+1)-th level outputs the first control signals and the second control signals in an alternated manner.

15. The LCD as claimed in claim 14, wherein the transistor control unit of the GOA driving unit of the n-th level outputs the first control signals in accordance with the first pull-down clock signals, and the transistor control unit of the GOA driving unit of the (n+1)-th level outputs the second control signals in accordance with the second pull-down clock signals; and wherein the first pull-down clock signals and the second pull-down clock signals are logically inverted.

16. The LCD as claimed in claim 14, wherein the first switch module, comprises a first pull-down transistor, a second pull-down transistor, and a third pull-down transistor, the second switch module, comprises a fourth pull-down transistor, a fifth pull-down transistor, and a sixth pull-down transistor;

wherein drains of the first pull-down transistor, the second pull-down transistor, the third pull-down transistor, the fourth pull-down transistor, the fifth pull-down transistor, and the sixth pull-down transistor respectively connects to the reference low-potential signals, sources of the first pull-down transistor and the fourth pull-down transistor respectively connect to the output end of the pull-up control circuit, the second pull-down transistor and the fifth pull-down transistor respectively connect to the output end of the level transfer circuit, sources of the third pull-down transistor and the sixth pull-down transistor respectively connect to the output end of the pull-up circuit;

with respect to the GOA driving units at the n-th level, gates of the first pull-down transistor, second pull-down transistor, and the third pull-down transistor connects to the first control signals, gates of the fourth pull-down transistor, the fifth pull-down transistor, and the sixth pull-down transistor connects to the second control signals; and with respect to the GOA driving unit at the (n+1)-th level, gates of the first pull-down transistor, the second pull-down transistor, and the third pull-down transistor connects to the second control signals, and gates of the fourth pull-down transistor, the fifth pull-down transistor, and the sixth pull-down transistor connects to the first control signals.

17. The LCD as claimed in claim 16, wherein the transistor control unit of the GOA driving unit of the n-th level outputs the first control signals in accordance with the first pull-down clock signals, and the transistor control unit of the GOA driving unit of the (n+1)-th level outputs the second control signals in accordance with the second pull-down clock signals; and wherein the first pull-down clock signals and the second pull-down clock signals are logically inverted.

18. The LCD as claimed in claim 17, wherein the transistor control unit, comprises a first controllable transistor, a second controllable transistor, a third controllable transistor, and a fourth controllable transistor, a gate and a source of the first controllable transistor are interconnected to receive the corresponding pull-down clock signals, a drain of the first controllable transistor connects to a source of the second controllable transistor, a drain of the second controllable transistor connects to the reference low-potential signals, a source of the third controllable transistor connects to the first controllable transistor to receive the pull-down clock signals, a drain of the third controllable transistor connects to a source of the fourth controllable transistor, a drain of the fourth controllable transistor connects to the reference low-potential signals;

with respect to the GOA driving unit of the n-th level, a drain of the first controllable transistor and a source of the third controllable transistor connects to the first pull-down clock signals, a gate of the second controllable transistor and a gate of the fourth controllable transistor respectively connect to the output end of the pull-up control circuit of the GOA driving unit of the n-th level, a drain of the third controllable transistor outputs the first control signals;

wherein with respect to the GOA driving unit of the (n+1)-th level, the sources of the first controllable transistor and the third controllable transistor connect to the second pull-down clock signals, the gate of the second controllable transistor and the gate of the fourth controllable transistor respectively connect to the output end of the pull-up control circuit of the GOA driving unit of the (n+1)-th level, the drain of the third controllable transistor outputs the second control signals; and the gate of the third controllable transistor of the GOA driving unit of the n-th level and the gate of the third controllable transistor of the GOA driving unit of the (n+1)-th level are interconnected.

\* \* \* \* \*